Oct. 29, 1957 HUO-BING YIN 2,811,646

TRANSISTOR OSCILLATOR CIRCUIT

Filed July 1, 1955

INVENTOR.
Huo-Bing Yin
BY H. Newton
ATTORNEY.

2,811,646
Patented Oct. 29, 1957

2,811,646

TRANSISTOR OSCILLATOR CIRCUIT

Huo-Bing Yin, Collingswood, N. J., assignor to Radio Corporation of America, a corporation of Delaware Application July 1, 1955, Serial No. 519,399

6 Claims. (Cl. 250—36)

Figure 1:
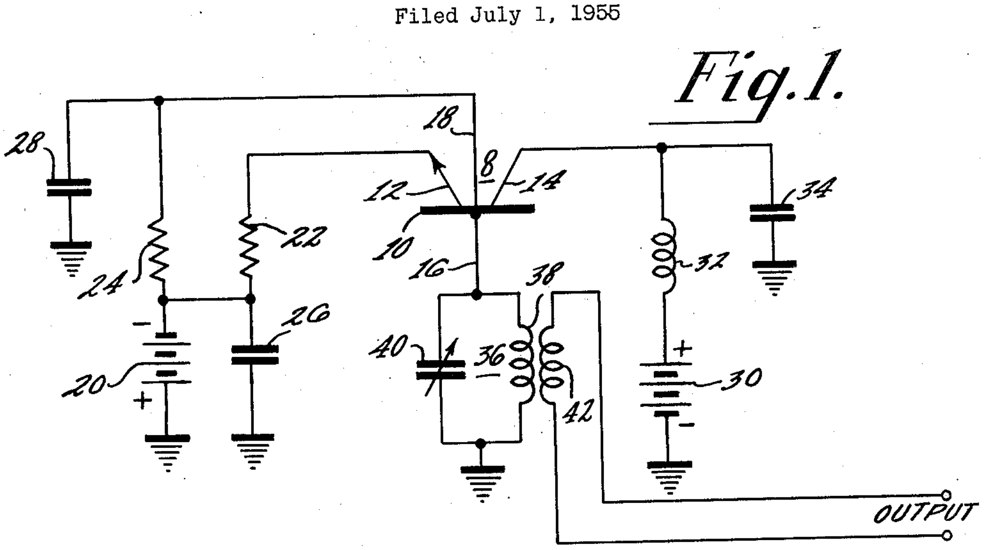

This invention relates to semi-conductor signal generators or oscillator circuits and in particular to such circuits utilizing four-electrode transistors such as tetrode transistors and the like.

In order to produce sustained oscillations by electrical means it is necessary to feed back a portion of the output signal from a signal amplifying device, whether it be an electron tube or a transistor, to the input circuit of the device. To this end, many of the known oscillator circuits contain an external feedback path which couples signal energy from the output circuit to the input circuit of the amplifying device of proper phase and magnitude to sustain continuous oscillation. In some oscillator circuits, a signal amplifying device having a negative resistance characteristic is utilized and by properly connecting a tuned circuit across the negative resistance, sustained oscillation is achieved. This method has been utilized with success in oscillator circuits using point contact transistors, for example, and results in circuit simplicity. In still other oscillator circuits, particularly those utilizing electron tubes, a reduction in the number of circuit components and hence circuit simplicity is achieved by utilizing the interelectrode capacitances of the tube to provide the feedback necessary for oscillation.

A four-electrode semi-conductor device, such as a tetrode transistor, has been connected in the past to provide sustained sine-wave oscillations. One advantage of this type semi-conductor oscillator circuit is that it is capable of providing oscillator signals of relatively high frequency. The known circuits generally require, however, the use of an external feedback path through which signals of proper phase and magnitude to sustain continuous oscillation are coupled from the output circuit of the transistor to its input circuit.

It is, accordingly, an object of the present invention to provide an improved oscillator circuit utilizing a semi-conductor device having four electrodes in which means providing the usual external feedback path for providing sustained oscillation may be eliminated.

It is another object of the present invention to provide an improved oscillation generator utilizing a tetrode transistor as the active element thereof wherein very high frequency signal operation is obtainable with a circuit utilizing a minimum number of circuit components.

These and further objects and advantages of the present invention are achieved by utilizing the interelectrode capacitances of a four-electrode transistor, such as a tetrode, to provide the feedback necessary for sustained oscillation in an oscillator circuit wherein such a transistor is the active element. Accordingly, by connecting a frequency determining circuit in the normal base circuit of the transistor, sustained oscillation is provided. To provide very high frequency oscillations, such as might be suitable for television receiver applications, a second frequency determining circuit is connected with the collector of the transistor and is tuned to a harmonic frequency. In this latter form of the invention, useful harmonic frequency oscillator signals are generated and may be derived, for example, from the collector of the transistor.

Figure 2:
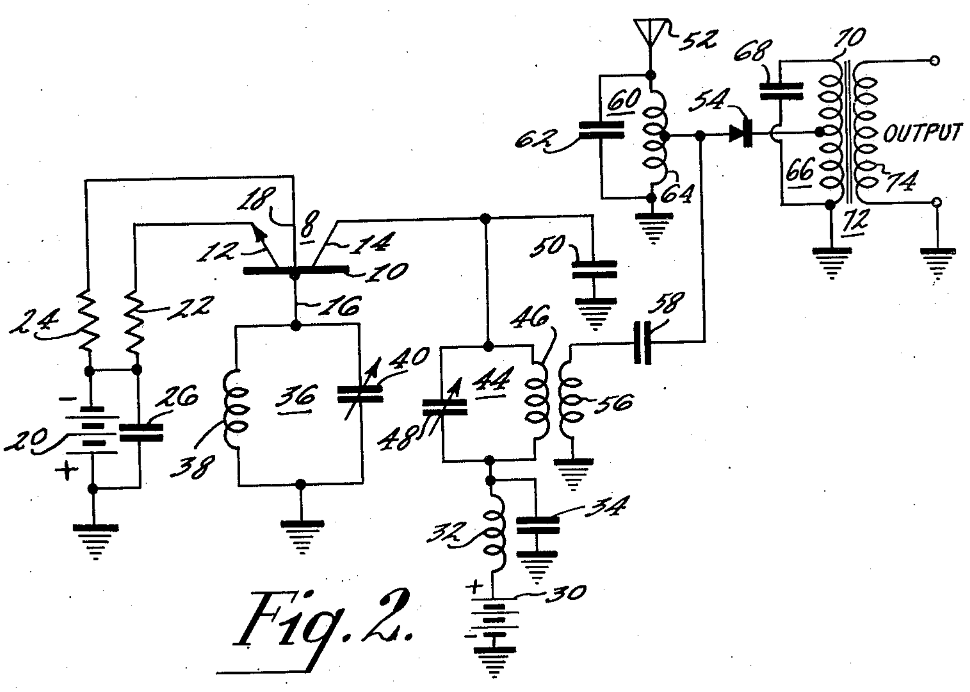

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of an oscillator circuit which includes a tetrode transistor in accordance with the invention, and Figure 2 is a schematic circuit diagram of a frequency converter circuit which includes a harmonic frequency oscillator circuit utilizing a tetrode transistor and embodying the invention.

Referring now to the drawing, wherein like parts are indicated by like reference numerals in both figures, and referring particularly to Figure 1, an oscillator circuit embodying the invention includes a transistor 8, which may be considered to be an N-P-N junction transistor of the tetrode type. The tetrode transistor 8 includes a semi-conductive body 10, with which four electrodes are cooperatively associated in a well known manner. These electrodes are designated, as is conventional, as an emitter 12, a collector 14 and first and second base electrodes 16 and 18, which may be referred to as a normal base electrode 16 and an auxiliary base electrode 18. Details concerning the construction and characteristics of a transistor of this type may be found in an article by Wallace et al. in the November 1952 issue of the Proceedings of the I. R. E., starting on page 1395. While the tetrode transistor 8 has been illustrated as being of P type conductivity, it could also be of N type conductivity, that is a P-N-P junction transistor, so long as the polarity of the various required biasing voltages was reversed.

To provide the required biasing voltages for the emitter 12 and the auxiliary base electrode 18 of the transistor 8, a battery 20 is provided, the positive terminal of which is connected to a point of fixed reference potential or ground for the system as shown. The negative terminal of the battery 20 is connected through a first resistor 22 to the emitter 12 and through a second resistor 24 to the auxiliary base electrode 18. A pair of by-pass capacitors is also provided, one of which, the capacitor 26, is connected in shunt with the battery 20 and the other of which, the capacitor 28, is connected from the junction of the resistor 24 and the auxiliary base electrode 18 to ground.

To provide a biasing voltage for the collector 14 of the tetrode transistor 8, a battery 30 is provided, the negative terminal of which is grounded. The positive terminal of the battery 30 is connected through a choke coil 32 to the collector 14. Proper signal by-pass is provided by a capacitor 34 which is connected from the junction of the collector 14 and the choke 32 to ground.

Frequency determining means in the form of a parallel resonant tank circuit 36 is provided for the oscillator circuit and is connected, in accordance with the invention, directly with the normal or first base 16 of the tetrode transistor 8. The parallel resonant circuit 36 includes an inductor 38 and a capacitor 40, which may be variable as shown for tuning the oscillator circuit over the desired range of fundamental frequencies. The output oscillator signals may be taken from any convenient point in the circuit but preferably are inductively coupled from the inductor 38 of the tank circuit 36. To this end, an output coupling winding 42 is provided which is inductively coupled with the inductor 38 of the tank circuit 36.

It has been found, in accordance with the invention, that by providing a circuit arrangement as shown the interelectrode capacitances of a tetrode transistor are sufficient to provide the necessary feedback for sustaining continuous oscillation. The interelectrode capacitances which contribute primarily to the required feedback from the normal base electrode 16 to the emitter 12 are those between the normal base and emitter and between the emitter and the collector. In effect, these two interelectrode capacitances form a capacitive voltage divider which is shunted by the capacitance which is formed by the tank capacitor 40 and the interelectrode capacitance between the normal base and collector. Thus the interelectrode capacitance between the emitter and the collector provides the emitter signal and the inter-electrode capacitance between the normal base and the emitter provides signal feedback from the base electrode. The frequency of the oscillator signal so generated is determined by the tank circuit 36 and may be varied by varying the capacity of the capacitor 40.

As described, an oscillator circuit embodying the invention is simple in construction, requiring but a single frequency determining circuit in addition to the normal biasing circuits. An oscillator circuit so constructed is capable of generating high frequency sine-wave oscillations with circuit operation which is reliable and efficient.

It has also been found, in accordance with the invention, that a tetrode transistor can be operated as a harmonic frequency signal generator, thus making it possible to obtain oscillator signals of a very high frequency. Thus an oscillator embodying the invention could be used as the local oscillator in television signal receiving systems, for example. A circuit for accomplishing this is illustrated in Figure 2 and includes, in general, a tetrode transistor 8 connected as a harmonic frequency generator, an antenna 52 and a crystal mixer 54.

The tetrode transistor 8 is of the same type as the one illustrated in Figure 1 and has similar biasing connections. A parallel resonant tank circuit 36, which is tuned to the fundamental frequency is also connected between the base 16 and ground. In addition, and in accordance with the invention, a second frequency determining or parallel resonant tank circuit 44 is connected directly with the collector 14 of the transistor 8. The parallel resonant circuit 44 includes an inductor 46 and a capacitor 48, which may be variable as shown for variably tuning the oscillator circuit to the desired harmonic frequency. The lower half of the tank circuit 44 is connected through the radio frequency choke 32 to the positive terminal of the biasing battery 30, the negative terminal of which is grounded. A by-pass capacitor 50 is also connected from the junction of the collector 14 and the tank circuit 44 to ground.

In operation, the interelectrode capacitances of the transistor 8 provide the feedback necessary for sustained oscillation of the circuit in the same manner as described in connection with Figure 1. However, in order to operate the circuit of Figure 2 efficiently at the harmonic frequencies, the by-passed capacitor 28 connected from the junction of the resistor 24 and the auxiliary base electrode 18 to ground should be removed. The oscillator circuit is tuned to the fundamental frequency by varying the capacity of the capacitor 40 of the fundamental frequency tank circuit 36. The tank circuit 44, which is tuned to a harmonic frequency signal of the fundamental frequency, has a substantially negligible impedance to signals at the fundamental frequency and will not, therefore, affect the development of the fundamental frequency signals. Since the signal currents flow through the harmonic frequency tank circuit 44, signals corresponding to the tuned harmonic frequency of the fundamental frequency will be developed across the tank circuit 44. The harmonic signals so developed may be inductively coupled from the inductor 46. To this end, an output coupling winding 56 is provided which is inductively coupled with the inductor 46 of the harmonic tank circuit 44.

The lower end of the coupling winding 56 is grounded, while its upper end is coupled through a coupling capacitor 58 to the cathode of the crystal mixer 54. A tuned radio frequency input circuit 60 is also provided and includes a capacitor 62 and an inductor 64. A tap on the inductor 64 is connected directly with the cathode of the crystal mixer 54. The anode of the crystal mixer is connected with a tap on an inductor 70 of a tuned parallel resonant output circuit 66, which also includes a capacitor 68. The output circuit 66 will normally be tuned to a beat or intermediate frequency signal. The inductor 70 of the output circuit 66 also serves as the primary winding of an output transformer 72 which also includes a secondary winding 74, from which the developed intermediate frequency signal will be derived.

In operation, the very high frequency harmonic signals developed across the tank circuit 44 by the harmonic frequency generator embodying the invention are coupled through the winding 56 and the coupling capacitor 58 to the crystal mixer 54. Received radio frequency signals are also applied to the crystal mixer 54 and are heterodyned with the harmonic oscillator signals to provide a beat or intermediate frequency signal. Thus, by provision of the invention, a circuit is disclosed which is capable of providing very high frequency oscillator signals, such as might be used for television signal receiving systems.

As described herein, very high frequency oscillator signals are generated by circuits which are simple in construction and require a minimum number of circuit components. In addition, reliable and efficient circuit operations are provided. Accordingly, oscillator circuits embodying the invention are particularly suited for high frequency circuit applications where circuit simplicity as well as reliability, stability and efficiency of operation are required or desired.

What is claimed is:

1. A high frequency oscillation generator comprising, in combination, a four-electrode semi-conductor device having a collector, an emitter, a normal base electrode, and an auxiliary base electrode and predetermined interelectrode capacitances, circuit means for applying energizing potentials to said collector, said emitter and said auxiliary base electrodes, and means including a frequency determining circuit connected with said normal base electrode and the interelectrode capacitances of said device for providing internal feedback between said normal base electrode and said emitter electrode of phase and magnitude to sustain continuous oscillation of said oscillation generator.

2. In a high frequency oscillator circuit including means providing a point of reference potential therein and a tetrode transistor having a collector, an emitter, a normal base electrode, and an auxiliary base electrode, the combination comprising, means providing a first source of direct current biasing potential connected in series between said emitter electrode and said point of reference potential and between said auxiliary base electrode and said point of reference potential, means providing a second source of direct current biasing potential connected in series between said collector electrode and said point of reference potential, and means including a frequency determining parallel resonant circuit connected between said normal base electrode and said point and the interelectrode capacitances of said transistor for providing feedback between said normal base electrode and said emitter electrode of phase and magnitude to sustain continuous oscillation of said oscillator circuit.

3. In a very high frequency oscillation generator the combination with a semi-conductor device having a collector, an emitter, a normal base electrode, and an auxiliary base electrode, said device having predetermined interelectrode capacitance, of circuit means for applying energizing potentials to said collector, said emitter and said auxiliary base electrodes, means for generating an oscillator signal including a first frequency determining circuit connected with said normal base electrode and tuned to a fundamental oscillator frequency and the interelectrode capacitance of said device providing regenerative internal feedback between said normal base and emitter electrodes, a second frequency determining circuit connected with said collector electrode and tuned to a harmonic frequency of said fundamental oscillator frequency, and output circuit means for deriving from said second frequency determining circuit a sinusoidal output wave at a frequency determined by the resonant frequency of said second frequency determining circuit.

4. A self-oscillating harmonic frequency generator comprising, in combination, a tetrode transistor having a collector, an emitter, a normal base electrode, and an auxiliary base electrode, means providing a first source of direct current biasing potential connected in series between said emitter electrode and a point of reference potential and between said auxiliary base electrode and said point, a first frequency determining circuit connected between said normal base electrode and said point and tuned to a fundamental oscillator frequency, a second frequency determining circuit connected with said collector electrode and tuned to a harmonic frequency of said fundamental oscillator frequency, means providing a second source of direct current biasing potential connected between said second frequency determining circuit and said point, the interelectrode capacitances of said transistor providing feedback between said normal base electrode and said emitter electrode of phase and magnitude to sustain continuous oscillation of said harmonic frequency generator, and output circuit means for deriving a sinusoidal output signal from said second frequency determining circuit at a frequency determined by the resonant frequency of said second frequency determining circuit.

5. A sine-wave oscillator circuit comprising a tetrode transistor including an emitter electrode, a collector electrode, a normal base electrode, and an auxiliary base electrode and having interelectrode capacitances between said normal base and collector electrodes, between said normal base and emitter electrodes, and between said emitter and collector electrodes to provide an internal regenerative signal feedback path between said normal base and emitter electrodes; circuit means for applying energizing potentials to said transistor; and a frequency determining parallel resonant circuit connected between said normal base electrode and a point of reference potential in said circuit and tunable to the oscillator frequency to provide with said interelectrode capacitances sustained oscillation of said oscillator circuit.

6. A harmonic frequency generator comprising a tetrode transistor including an emitter electrode, a collector electrode, a normal base electrode and an auxiliary base electrode and having interelectrode capacitances between said normal base and collector electrodes, between said normal base and emitter electrodes, and between said emitter and collector electrodes to provide a regenerative signal feedback path between said normal base and emitter electrodes; circuit means for applying energizing potentials to said transistor; a first frequency determining parallel resonant circuit connected between said normal base electrode and a point of reference potential and tuned to a fundamental frequency and tunable to the oscillator frequency to provide with said interelectrode capacitances sustained oscillation of said oscillator circuit, and a second frequency determining parallel resonant circuit connected with said collector electrode and tuned to a harmonic frequency of said fundamental frequency.

References Cited in the file of this patent

UNITED STATES PATENTS 2,640,919 Bell et al. -------------- June 2, 1953

FOREIGN PATENTS 1,010,196 France ---------------- Mar. 19, 1952

OTHER REFERENCES

Article: "A Junction Transistor Tetrode for High Frequency Use," by Wallace et al.; P. I. R. E., vol. 40, No. 11, pages 1395–1400, for Nov. 1952.

Article: "A Study of Transistor Circuits for Television," by Sziklai et al.; PIRE for June 1953; pages 708–714.

Article: "High Frequency Transistor Tetrode," by Wallace et al.; from Electronics for January 1953; pages 112–113.